US010324155B2

United States Patent
Schwab et al.

(10) Patent No.: US 10,324,155 B2
(45) Date of Patent: Jun. 18, 2019

(54) SPARSE RECOVERY OF FIBER ORIENTATIONS USING MULTIDIMENSIONAL PRONY METHOD

(71) Applicant: Siemens Healthcare GmbH, Erlangen (DE)

(72) Inventors: Evan Schwab, Baltimore, MD (US); Hasan Ertan Cetingul, Fulton, MD (US); Boris Mailhe, Plainsboro, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 156 days.

(21) Appl. No.: 15/272,867

(22) Filed: Sep. 22, 2016

(65) Prior Publication Data
US 2018/0081018 A1   Mar. 22, 2018

(51) Int. Cl.
*G01R 33/56* (2006.01)
*G01R 33/563* (2006.01)
*G01R 33/567* (2006.01)

(52) U.S. Cl.
CPC ... *G01R 33/56341* (2013.01); *G01R 33/5608* (2013.01); *G01R 33/5673* (2013.01)

(58) Field of Classification Search
CPC .... G01R 33/56; G01R 33/567; G01R 33/563; G01R 33/56341; G01R 33/5673; G01R 33/5608; G01R 33/5611; G01R 33/4818
See application file for complete search history.

(56) References Cited

U.S. PATENT DOCUMENTS

2008/0272781 A1* 11/2008 Chiang ............ G01R 33/56341
324/312
2010/0253337 A1* 10/2010 Tseng ............... G01R 33/56341
324/309

(Continued)

OTHER PUBLICATIONS

Bendory, Tamir, Shai Dekel, and Arie Feuer. "Super-resolution on the sphere using convex optimization." IEEE Transactions on Signal Processing 63.9 (2015): 2253-2262.

(Continued)

*Primary Examiner* — Son T Le

(57) ABSTRACT

A computer-implemented method for sparse recovery of fiber orientations using a multidimensional Prony method for use in tractography applications includes performing magnetic resonance imaging to acquire a plurality of sparse signal measurements using a q-space sampling scheme which enforces a lattice structure with a predetermined number of collinear samples. Next, for each voxel included in the plurality of sparse signal measurements, a computer system is used to perform a parameter estimation process. This process includes translating a portion of the sparse signal measurements corresponding to the voxel into a plurality of Sparse Approximate Prony Method (SAPM) input parameters, and applying a SAPM process to the SAPM input parameters to recover a number of fiber populations, a plurality of orientation vectors, and a plurality of amplitude scalars. Then, one or more tractograms are generated using the number of fiber populations, the orientation vectors, and the amplitude scalars recovered for each voxel.

20 Claims, 6 Drawing Sheets

(56) References Cited

U.S. PATENT DOCUMENTS

| | | | | |
|---|---|---|---|---|
| 2013/0259340 A1* | 10/2013 | Tseng | ............... | G01R 33/56341 382/131 |
| 2013/0278257 A1* | 10/2013 | Boada | ................ | G01R 33/561 324/309 |
| 2014/0167753 A1* | 6/2014 | Sperl | ............... | G01R 33/56341 324/309 |
| 2014/0210474 A1* | 7/2014 | Haldar | ............. | G01R 33/56341 324/318 |
| 2017/0003368 A1* | 1/2017 | Rathi | ............... | G01R 33/56341 |

OTHER PUBLICATIONS

Deslauriers-Gauthier, Samuel, and Pina Marziliano. "Spherical finite rate of innovation theory for the recovery of fiber orientations." Engineering in Medicine and Biology Society (EMBC), 2012 Annual International Conference of the IEEE. IEEE, 2012.

Deslauriers-Gauthier, Samuel, and Pina Marziliano. "Sampling great circles at their rate of innovation." SPIE Optical Engineering+ Applications. International Society for Optics and Photonics, 2013.

Deslauriers-Gauthier, Samuel, and Pina Marziliano. "Sampling signals with a finite rate of innovation on the sphere." IEEE Transactions on Signal Processing 61.18 (2013): 4552-4561.

Deslauriers-Gauthier, Samuel, et al. "The application of a new sampling theorem for non-bandlimited signals on the sphere: Improving the recovery of crossing fibers for low b-value acquisitions." Medical image analysis 30 (2016): 46-59.

Dokmanić, Ivan, and Yue M. Lu. "Sampling spherical finite rate of innovation signals." Acoustics, Speech and Signal Processing (ICASSP), 2015 IEEE International Conference on. IEEE, 2015.

Jian, Bing, and Baba C. Vemuri. "A unified computational framework for deconvolution to reconstruct multiple fibers from diffusion weighted MRI." IEEE transactions on medical imaging 26.11 (2007): 1464-1471.

Potts, Daniel, and Manfred Tasche. "Parameter estimation for exponential sums by approximate Prony method." Signal Processing 90.5 (2010): 1631-1642.

* cited by examiner

SPARSE RECOVERY OF FIBER ORIENTATIONS USING MULTIDIMENSIONAL PRONY METHOD

TECHNICAL FIELD

The present disclosure relates generally to diffusion Magnetic Resonance Imaging (dMRI) and methods, systems, and apparatuses for performing a sparse recovery of fiber orientations using a multidimensional Prony method. The disclosed techniques may be applied, for example in various tractography applications.

BACKGROUND

Diffusion magnetic resonance imaging (dMRI) is a medical imaging modality used to model the anatomical network of neuronal fibers in the white matter (WM) of the brain, in vivo. By measuring spatial degrees of water diffusion in the WM with diffusion weighted images (DWI), one can estimate the most probable directions of fiber bundles in each voxel of the brain. Then, with these probabilistic peak directions at each voxel, tractography algorithms may be invoked to trace out the most anatomically accurate fiber tracts in the brain, the results of which are used to study neurological diseases through computational anatomy, network analysis and diagnostic classification.

To reconstruct an accurate white matter fiber network, probability density functions, modeled as either an ensemble average propagator (EAP) or orientation distribution function (ODF) at each voxel, must be accurately estimated from the dMRI signals and then the function peaks must be identified. Peak finding algorithms suffer from noise and discretization, and are subject to an accurate probability distribution to begin with. Furthermore, to acquire an accurate dMRI signal and represent locally complex (e.g., crossing) fibers, many samples in the wavevector (q–) space must be measured. High Angular Resolution Diffusion Imaging (HARDI) was developed to sample with high angular resolution on single or multiple shells in q-space to overcome the limitations of a single peak assumption of Diffusion Tensor Imaging (DTI). However, reconstructing accurate signals using methods such as HARDI or Diffusion Spectrum Imaging (DSI), which samples q-space densely on the Cartesian grid, require longer scan times which impedes greatly on their clinical applicability.

Accordingly, it is desired to reduce the scan time of dMRI protocols such as HARDI or DSI without compromising the quality of the signal reconstruction, while accurately finding probability peaks for tractography without losing accuracy through first estimating EAPs or ODF s.

SUMMARY

Embodiments of the present invention address and overcome one or more of the above shortcomings and drawbacks, by providing methods, systems, and apparatuses related to performing a sparse recovery of fiber orientations using multidimensional Prony method. More specifically, a framework is described herein for performing sparse recovery of diffusion orientations and magnitudes directly from a sparse number of measurements of raw signal data.

According to some embodiments, a computer-implemented method for sparse recovery of fiber orientations using a multidimensional Prony method for use in tractography applications includes performing magnetic resonance imaging to acquire a plurality of sparse signal measurements using a q-space sampling scheme which enforces a lattice structure with a predetermined number of collinear samples. Next, for each voxel included in the plurality of sparse signal measurements, a computer system is used to perform a parameter estimation process. This process includes translating a portion of the sparse signal measurements corresponding to the voxel into a plurality of Sparse Approximate Prony Method (SAPM) input parameters, and applying a SAPM process to the SAPM input parameters to recover a number of fiber populations, a plurality of orientation vectors, and a plurality of amplitude scalars. The SAPM process may utilize, for example, a Matrix Pencil Prony method or a MUSIC Prony method to solve a series of Finite Rate of Innovation (FRI) problems to perform the recovery. In some embodiments, the computer system is a parallel computing architecture and the parameter estimation process is performed for multiple voxels in parallel across a plurality of processing units. Following the parameter estimation process, one or more tractograms are generated using the number of fiber populations, the orientation vectors, and the amplitude scalars recovered for each voxel.

The aforementioned method can be refined in different embodiments with various additional features. For example, in some embodiments of the aforementioned method, the q-space sampling scheme is a Diffusion Spectrum Imaging (DSI) grid sampling scheme employing a 3D grid which is subsampled by sampling collinearly along a plurality of random lines in 3D space. In other embodiments, the q-space sampling scheme utilizes a single gradient table with a plurality of b-values. For example, in one embodiment, the q-space sampling scheme is a multi-shell sampling scheme with samples placed collinearly along a plurality of random rays passing through a common origin of shells in 3D space. In some embodiments of the aforementioned method, the portion of the sparse signal measurements corresponding to the voxel is translated into the SAPM input parameters by formulating the sparse signal measurements corresponding to the voxel as a finite sum of the plurality of orientation vectors and the plurality of amplitude scalars multiplied by a Fourier transform of a kernel (e.g., a Gaussian kernel).

According to other embodiments, an article of manufacture for sparse recovery of fiber orientations using a multidimensional Prony method for use in tractography applications comprises a non-transitory, tangible computer-readable medium holding computer-executable instructions for performing the aforementioned method, with or without the various enhancements and modifications discussed above.

According to other embodiments, a system for sparse recovery of fiber orientations using a multidimensional Prony method for use in tractography applications comprises a magnetic resonance imaging device and a computer system. The magnetic resonance imaging device comprises coils which are configured to acquire sparse signal measurements using a q-space sampling scheme which enforces a lattice structure with a predetermined number of collinear samples. The computer system is configured to perform a parameter estimation process for each voxel included in the sparse signal measurements. This parameter estimate process includes translating a portion of the sparse signal measurements corresponding to the voxel into a plurality of Sparse Approximate Prony Method (SAPM) input parameters, and applying a SAPM process to the SAPM input parameters to recover a number of fiber populations, a plurality of orientation vectors, and a plurality of amplitude scalars. The computer system is also configured to generate one or more tractograms using the number of fiber populations, the orientation vectors, and the amplitude scalars recovered for each voxel. In some embodiments, the computer system is a parallel computing architecture and the parameter estimation process is performed for multiple voxels in parallel across a plurality of processing units.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

The following disclosure describes the present invention according to several embodiments directed at methods, systems, and apparatuses for performing a sparse recovery of fiber orientations using multidimensional Prony method. The techniques described herein perform sparse recovery of diffusion (and hence fiber) orientations and magnitudes directly from a sparse number of measurements of raw signal data. These techniques provide a unified framework that connects the sparsity of parameter estimation to a sparse number of signal measurements. A Finite Rate of Innovation (FRI) framework is adopted to recover a stream of 3D Dirac deltas which define the probability distribution function in each voxel of a diffusion magnetic resonance imaging (dMRI) brain dataset. In contrast to conventional techniques, embodiments of present invention reject the basis representation of spherical functions used for Spherical Deconvolution (SD). Instead, the full relationship between the dMRI signal and the ensemble average propagator (EAP) is considered as the 3D Fourier transform. If one assumes the EAP is a stream of 3D pulses, or a stream of Dirac Deltas convolved with a chosen kernel, then the dMRI signal may be written as a finite sum of complex exponentials, multiplied by the Fourier transform of our kernel. With this formulation, an FRI problem is set up in three dimensions for which we can apply a recent advance in multidimensional FRI known as the Sparse Approximate Prony Method (SAPM). This approach is able to recover a sparse number of Dirac deltas in 3D directly from a sparse number of signal measurements. Furthermore, the algorithm is designed to handle noisy signals and also estimates the number of Dirac deltas, so that the number of peaks of the EAP does not need to be known ahead of time.

Figure 1:
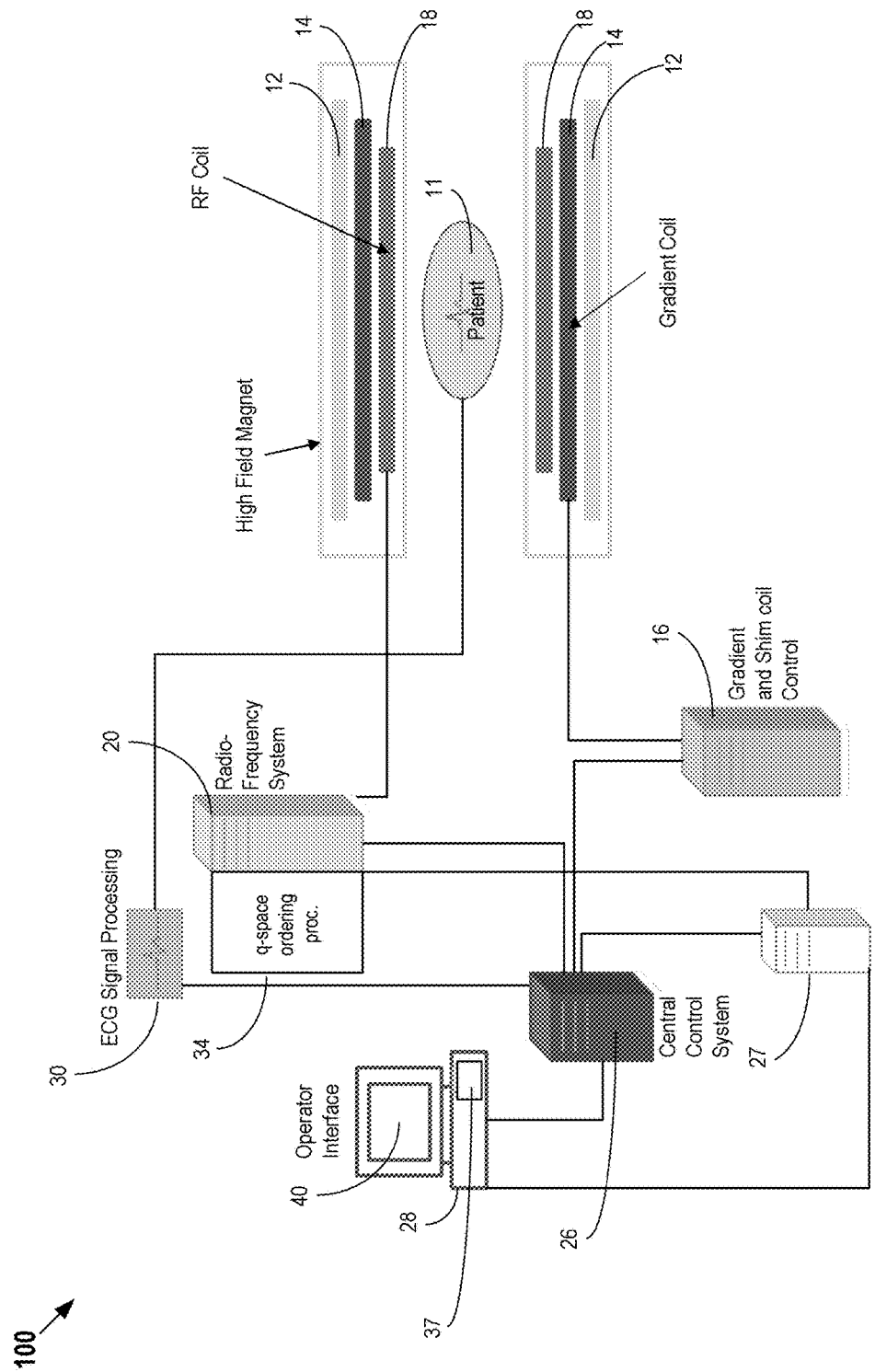
FIG. 1 shows a system for ordering acquisition of frequency domain components representing magnetic resonance (MR) image data for storage in a q-space storage array, as used by some embodiments of the present invention.

FIG. 1 shows a system 100 for acquiring a dMRI brain dataset for storage in a q-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further, radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and q-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. Electrocardiography (ECG) synchronization signal generator 30 provides ECG signals used for pulse sequence and imaging synchronization. A two or three dimensional q-space storage array of individual data elements in q-space component processor unit 34 stores corresponding individual frequency components comprising an MR dataset. The q-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which the radius of respective corresponding individual data elements increases and decreases along a substantially spiral path as the multiple individual frequency components is sequentially acquired during acquisition of an MR dataset representing an MR image. A storage processor in the q-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and the magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example.

Using sparse number of measurements of a raw signal dataset acquired using the system 100 shown in FIG. 1, sparse recovery of diffusion orientations and magnitudes may be performed directly without any intermediary modeling steps. This recovery is based on the relationship of the raw diffusion signal, e.g., acquired through diffusion spectrum imaging (DSI), to the ensemble average propagator (EAP) by the 3D Fourier transform:

$$E(q) = \int_{R \in \mathbb{R}^3} P(R) e^{-2\pi i q \cdot R} dR \quad (1)$$

where E(q) is provided via the dMRI measurements. As is well understood in the art, a dMRI acquisition results in a collection of diffusion weighted images {S(q)} and one or more images $S_0$ which are acquired without diffusion sensitivity (i.e., where the b-values for the dMRI acquisition are 0). Taking the ratio of $$\frac{s(q)}{s_0}$$

results in E(q). P(R) is the EAP. Here, it is assumed that the EAP is an ensemble of oriented Dirac deltas pulses in 3D space, or $$P(R) = \sum_{k=1}^{K} a_k h(R - R_k) \quad (2)$$

where $K \in \mathbb{N}$ is the number of peaks, at 3D orientation vectors $R_k \in \mathbb{R}^3$ with real non-negative amplitude $a_k \in \mathbb{R}_+$ (i.e., the contribution at that direction). In general a relatively small value of K may be utilized (e.g., 3 to 5), with the assumption that there may be redundancy in the data or the magnitudes of some of the amplitudes will be so small that they can be ignored.

Substituting Equation (2) into Equation (1), we arrive at:

$$E(q) = H(q) \sum_{k=1}^{K} a_k e^{-2\pi i q \cdot R_k} \quad (3)$$

$$\Rightarrow y(q) := \frac{E(q)}{H(q)} = \sum_{k=1}^{K} a_k e^{-2\pi i q \cdot R_k} \quad (4)$$

where H is the Fourier Transform of h. A natural kernel to use in the dMRI framework is Gaussian. When h is a Gaussian pulse, we have $$H(q) = e^{-bd q^T q} \quad (5)$$

where b is the b-value at vector q. The b-value reflects the strength and timing of the gradients used to generate diffusion-weighted images associated with q. The higher the b-value, the stronger the diffusion effects at q. The value of d in Equation (5) is a standard deviation parameter that describes the general Gaussian shape of the kernel. It should be noted that the definition of H in Equation (5) is only one example of the functions which may be utilized with the framework presented in Equations (3) and (4). In other embodiments, different kernels may be applied with different corresponding H functions.

Figure 2:
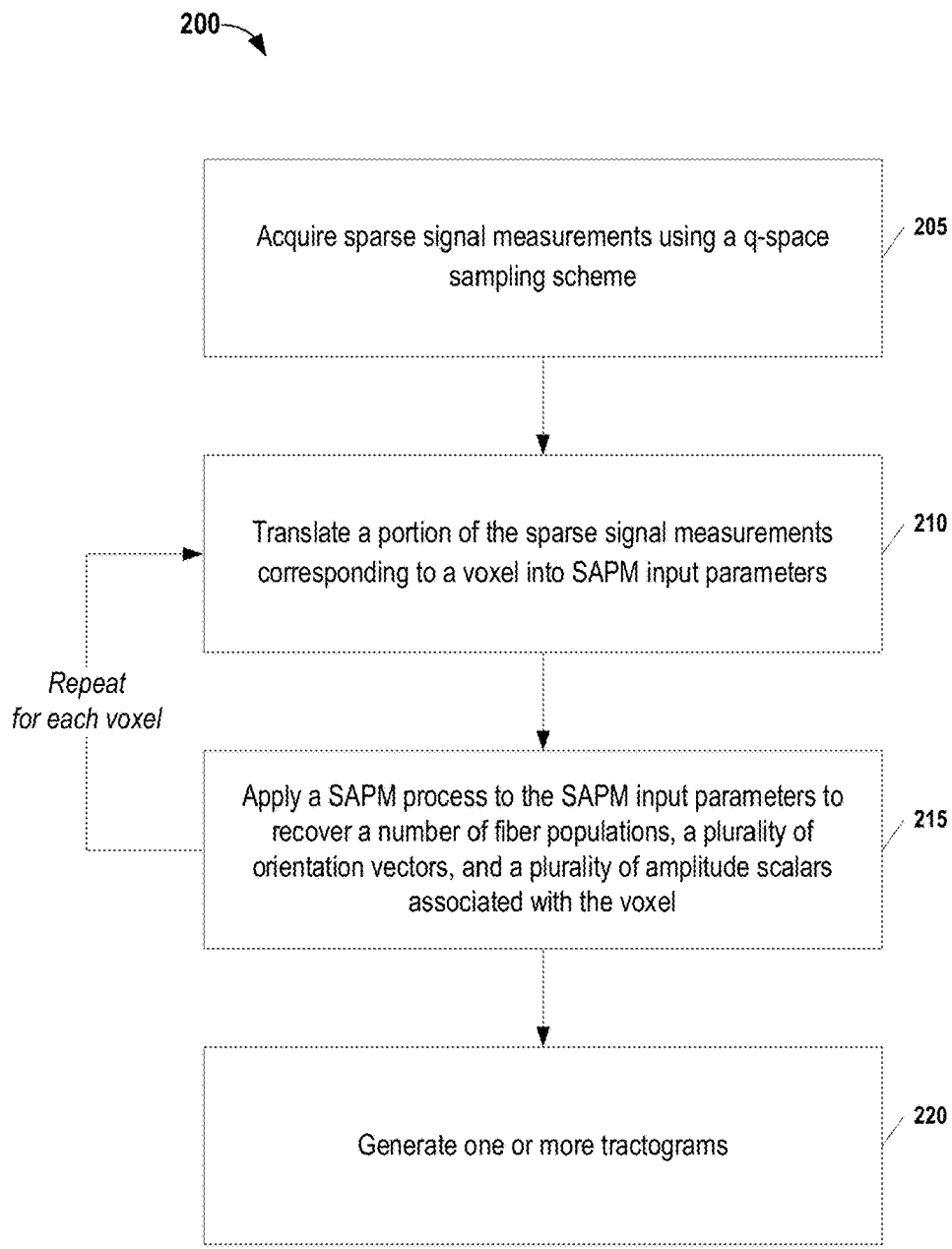
FIG. 2 provides an example process for applying the techniques discussed above to perform recovery of fiber orientations using multidimensional Prony method, according to some embodiments.

FIG. 2 provides an example process 200 for applying the techniques discussed above to perform recovery of fiber orientations using multidimensional Prony method, according to some embodiments. The goal is to recover the parameters $a_k$, $R_k$ as well as the number of fiber populations K that make up the EAP P. Since the model is described fully by a sparse number of parameters (4K), it is also the goal to recover these parameters using a proportionally sparse number of measurements of the signal E. This problem can then be solved using the Sparse Approximate Prony Method (SAPM) for dimension d=3 which allows us to use only a sparse number of samples to recover our parameters in the presence of noise.

Figure 3:
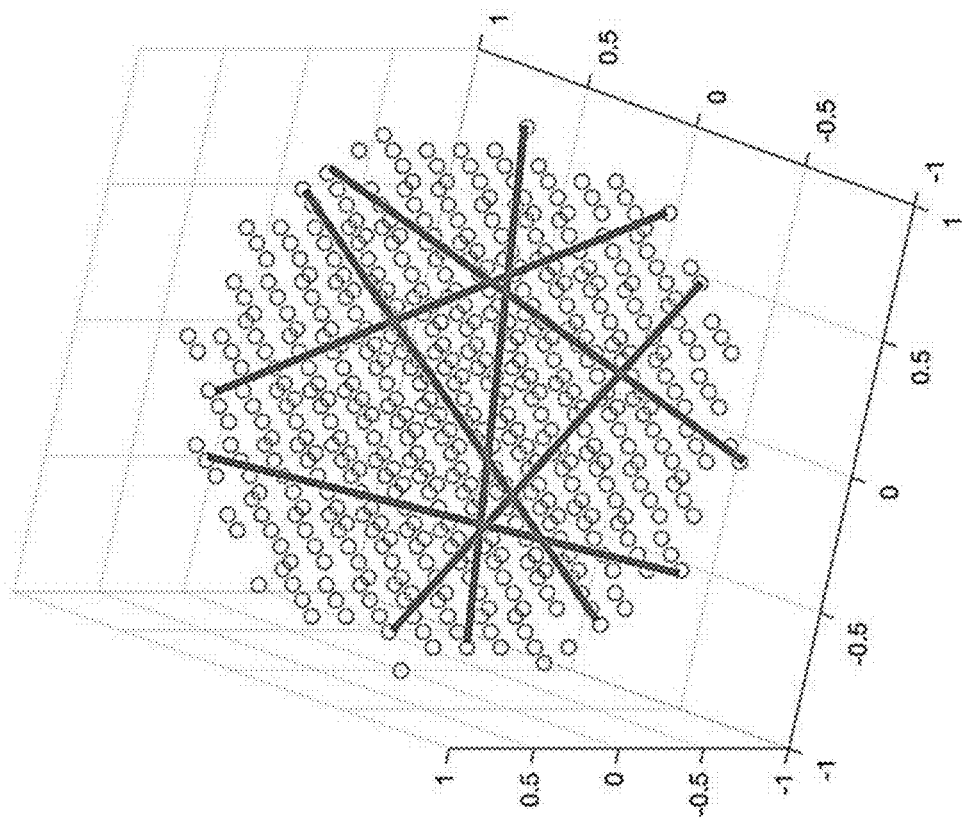
FIG. 3 provides one example of how these lines may be distributed on a 3D sphere, according to some embodiments.

Starting at step 205, a dMRI system (e.g., system 100 shown in FIG. 1) acquires sparse signal measurements using a q-space sampling scheme which enforces a lattice structure with a predetermined number of collinear samples. This number may be specified either by the user at runtime or, alternatively, a preset value may be encoded in the device which enforces sparsity over the acquisition. In some embodiments, the q-space sampling scheme utilizes a single gradient table with a plurality of b-values. This may be implemented, for example, using a multi-shell sampling scheme. In other embodiments, the q-space sampling scheme is a Diffusion Spectrum Imaging (DSI) grid sampling scheme which subsamples a 3D grid by sampling collinearly along random lines in 3D space. FIG. 3 provides one example of how these lines may be distributed on a 3D sphere, according to some embodiments.

Continuing with reference to FIG. 2, at steps 210 and 215, a parameter estimation process is performed for each voxel included in the plurality of sparse signal measurements. At step 210, the portion of the sparse signal measurements corresponding to the voxel is translated into SAPM input parameters. As described above with respect to Equations 1-4, this translation may be performed by formulating the sparse signal measurements corresponding to each voxel as a finite sum of orientation vectors and amplitude scalars multiplied by a Fourier transform of a kernel (e.g., a Gaussian kernel). Then, at step 215, a SAPM process is applied to the SAPM input parameters to recover a number of fiber populations, a plurality of orientation vectors, and a plurality of amplitude scalars associated with the voxel. This SAPM process may utilize techniques such as the Matrix Pencil Prony method or the MUSIC Prony method to solve a series of FRI problems to recover the data. Steps 210 and 215 are repeated for each voxel in the measurement dataset.

Figure 4:
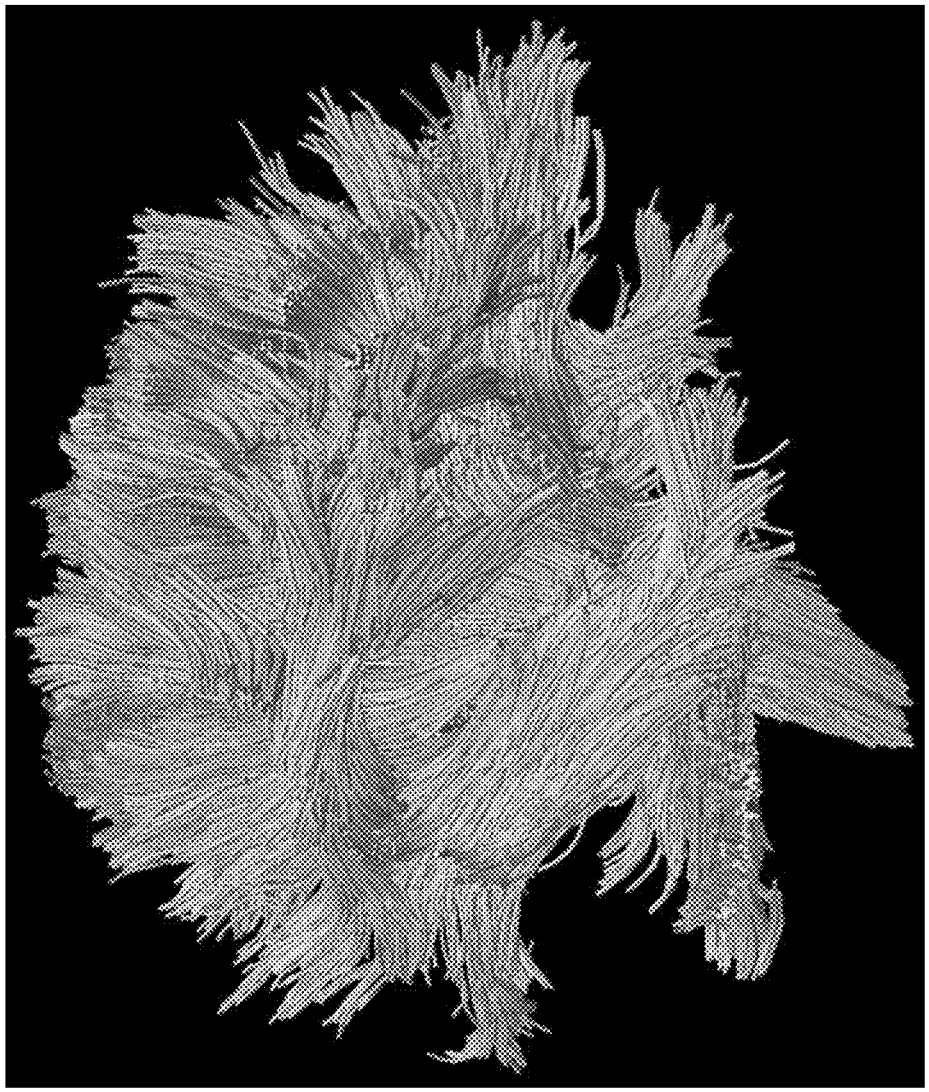
FIG. 4 provides an example tractogram that may be generated by some embodiments of the present invention.

At step 220, one or more tractograms are generated using the collected number of fiber populations, orientation vectors, and amplitude scalars which were recovered for each voxel at steps 210 and 215. An example tractogram that may be generated is shown in FIG. 4. It should be noted that, while this example is presented in grayscale, tractograms may be generated which utilize color to distinguish individual fibers, etc.

Figure 5:
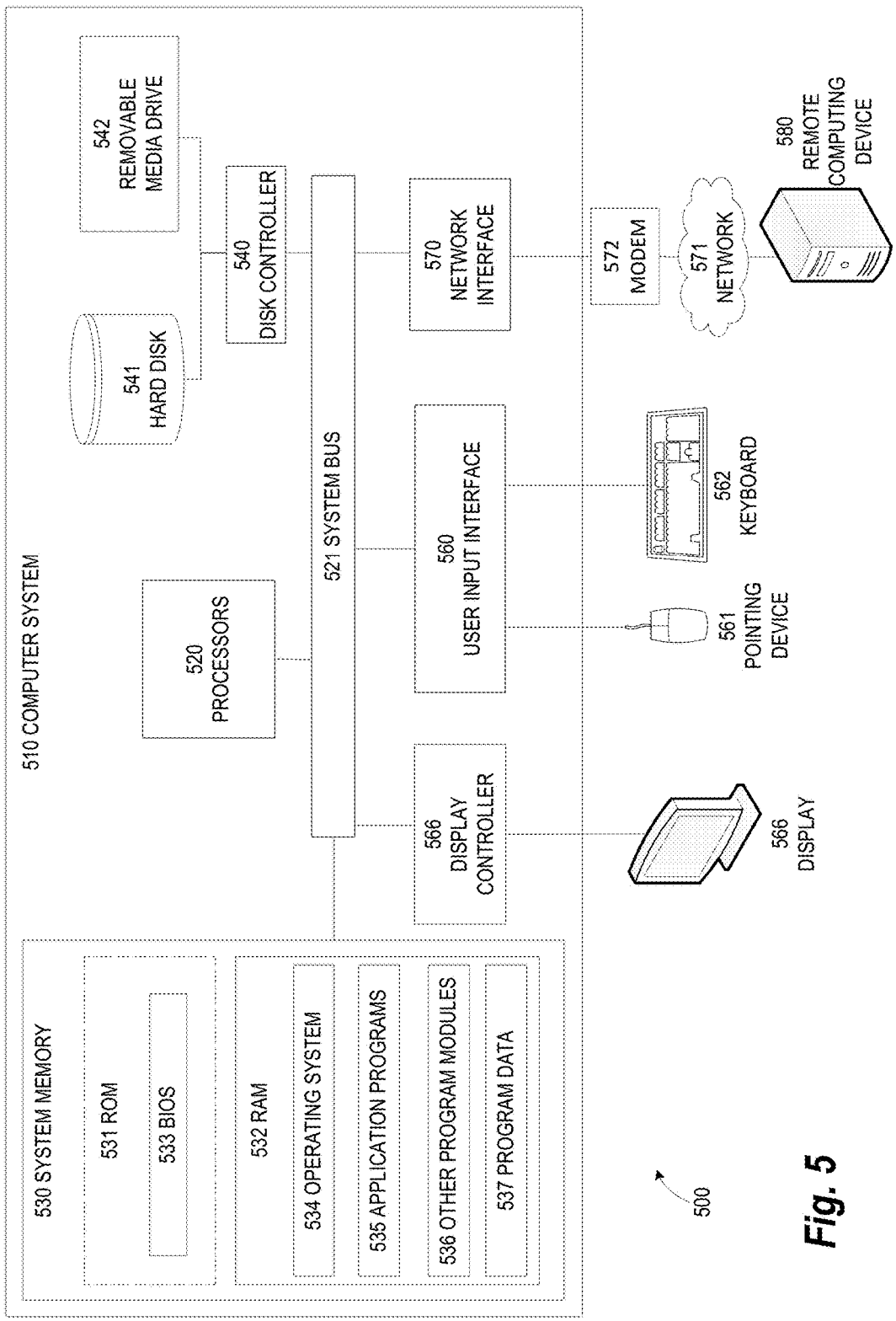
FIG. 5 illustrates an exemplary computing environment within which embodiments of the invention may be implemented.

FIG. 5 illustrates an exemplary computing environment 500 within which embodiments of the invention may be implemented. For example, this computing environment 500 may be used to implement any of the computers shown in FIG. 1, as well as the method 200 described in FIG. 2. The computing environment 500 may include computer system 510, which is one example of a computing system upon which embodiments of the invention may be implemented. Computers and computing environments, such as computer system 510 and computing environment 500, are known to those of skill in the art and thus are described briefly herein.

As shown in FIG. 5, the computer system 510 may include a communication mechanism such as a bus 521 or other communication mechanism for communicating information within the computer system 510. The computer system 510 further includes one or more processors 520 coupled with the bus 521 for processing the information. The processors 520 may include one or more central processing units (CPUs), graphical processing units (GPUs), or any other processor known in the art.

The computer system 510 also includes a system memory 530 coupled to the bus 521 for storing information and instructions to be executed by processors 520. The system memory 530 may include computer readable storage media in the form of volatile and/or nonvolatile memory, such as read only memory (ROM) 531 and/or random access memory (RAM) 532. The system memory RAM 532 may include other dynamic storage device(s) (e.g., dynamic RAM, static RAM, and synchronous DRAM). The system memory ROM 531 may include other static storage device(s) (e.g., programmable ROM, erasable PROM, and electrically erasable PROM). In addition, the system memory 530 may be used for storing temporary variables or other intermediate information during the execution of instructions by the processors 520. A basic input/output system 533 (BIOS) containing the basic routines that help to transfer information between elements within computer system 510, such as during start-up, may be stored in ROM 531. RAM 532 may contain data and/or program modules that are immediately accessible to and/or presently being operated on by the processors 520. System memory 530 may additionally include, for example, operating system 534, application programs 535, other program modules 536 and program data 537.

The computer system 510 also includes a disk controller 540 coupled to the bus 521 to control one or more storage devices for storing information and instructions, such as a hard disk 541 and a removable media drive 542 (e.g., floppy disk drive, compact disc drive, tape drive, and/or solid state drive). The storage devices may be added to the computer system 510 using an appropriate device interface (e.g., a small computer system interface (SCSI), integrated device electronics (IDE), Universal Serial Bus (USB), or FireWire).

The computer system 510 may also include a display controller 565 coupled to the bus 521 to control a display 566, such as a cathode ray tube (CRT) or liquid crystal display (LCD), for displaying information to a computer user. The computer system includes an input interface 560 and one or more input devices, such as a keyboard 562 and a pointing device 561, for interacting with a computer user and providing information to the processor 520. The pointing device 561, for example, may be a mouse, a trackball, or a pointing stick for communicating direction information and command selections to the processor 520 and for controlling cursor movement on the display 566. The display 566 may provide a touch screen interface which allows input to supplement or replace the communication of direction information and command selections by the pointing device 561.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium, such as a hard disk 541 or a removable media drive 542. The hard disk 541 may contain one or more data stores and data files used by embodiments of the present invention. Data store contents and data files may be encrypted to improve security. The processors 520 may also be employed in a multi-processing arrangement to execute the one or more sequences of instructions contained in system memory 530. In alternative embodiments, hardwired circuitry may be used in place of or in combination with software instructions. Thus, embodiments are not limited to any specific combination of hardware circuitry and software.

As stated above, the computer system 510 may include at least one computer readable medium or memory for holding instructions programmed according to embodiments of the invention and for containing data structures, tables, records, or other data described herein. The term "computer readable medium" as used herein refers to any medium that participates in providing instructions to the processor 520 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 541 or removable media drive 542. Non-limiting examples of volatile media include dynamic memory, such as system memory 530. Non-limiting examples of transmission media include coaxial cables, copper wire, and fiber optics, including the wires that make up the bus 521. Transmission media may also take the form of acoustic or light waves, such as those generated during radio wave and infrared data communications.

The computing environment 500 may further include the computer system 510 operating in a networked environment using logical connections to one or more remote computers, such as remote computer 580. Remote computer 580 may be a personal computer (laptop or desktop), a mobile device, a server, a router, a network PC, a peer device or other common network node, and typically includes many or all of the elements described above relative to computer system 510. When used in a networking environment, computer system 510 may include modem 572 for establishing communications over a network 571, such as the Internet. Modem 572 may be connected to bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computer 580). The network 571 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

Figure 6:
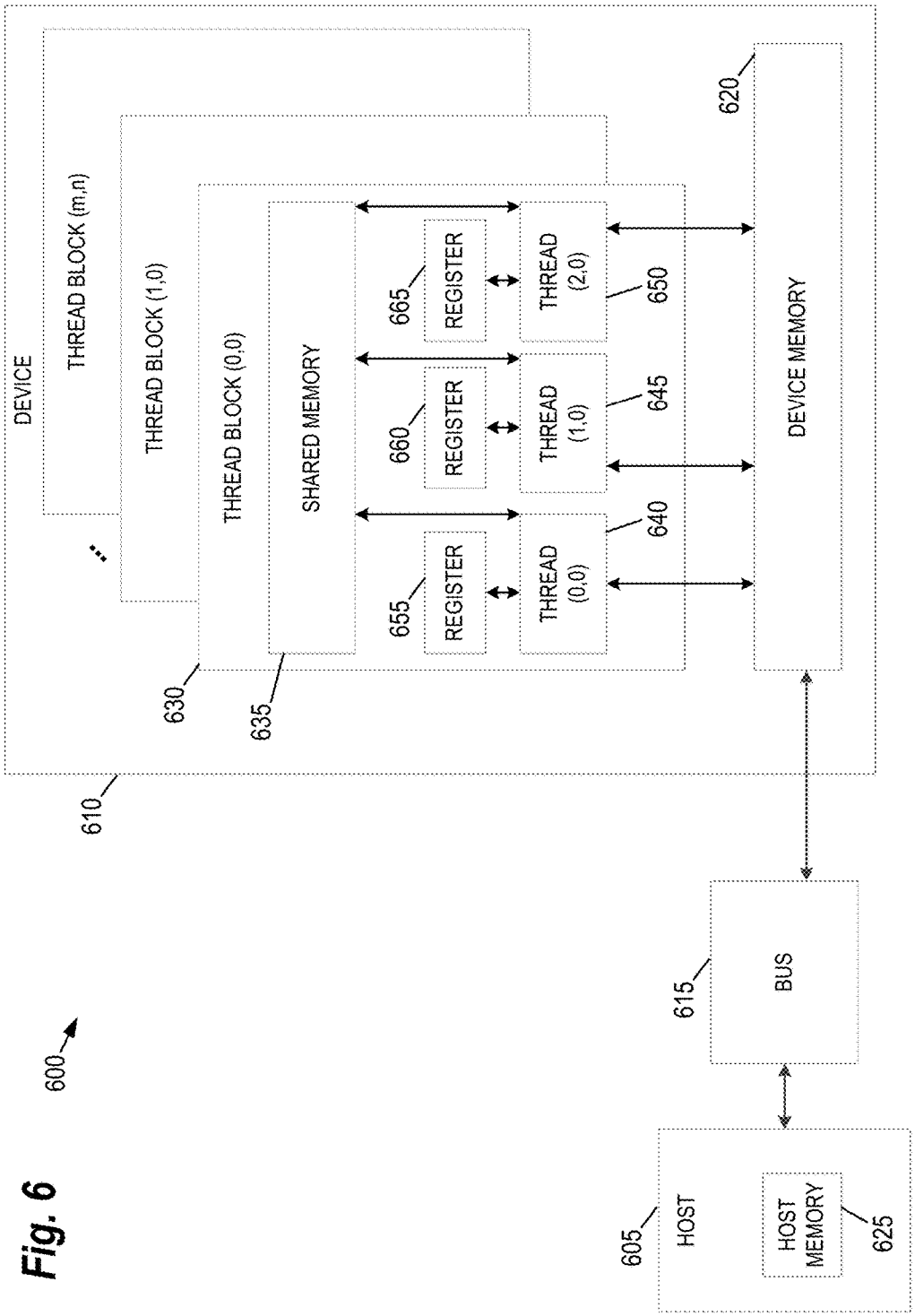
FIG. 6 provides an illustration of the parallel processing platform that may be utilized to accelerate SAPM calculations or tractogram generation, according to some embodiments.

FIG. 6 provides an illustration of the parallel processing platform 600 that may be utilized to accelerate SAPM calculations or tractogram generation, according to some embodiments. For example, the parallel processing platform 600 may be utilized to performed portions of the process 200 in FIG. 2 for multiple voxels in parallel across a plurality of processing units. The parallel processing platform 600 may be used, for example, for implementations of the present invention where NVIDIA™ Compute Unified Device Architecture (CUDA) or a similar parallel computing platform is used. The architecture illustrated in FIG. 6 includes a host computing unit ("host") 605 and a GPU device ("device") 610 connected via a bus 615 (e.g., a PCIe bus). The host 605 includes the CPU (not shown in FIG. 6) and host memory 625 accessible to the CPU. The graphical processing device 610 includes the GPU and its associated device memory 620, referred to herein as device memory. The device memory 620 may include various types of memory, each optimized for different memory usages. For example, in some embodiments, the graphical processing device memory includes global memory, constant memory, and texture memory. Parallel portions of an application may be executed on the platform 600 as "device kernels" or simply "kernels." A kernel comprises parameterized code configured to perform a particular function. The parallel computing platform is configured to execute these kernels in an optimal manner across the platform 600 based on parameters, settings, and other selections provided by the user. Additionally, in some embodiments, the parallel computing platform may include additional functionality to allow for automatic processing of kernels in an optimal manner with minimal input provided by the user.

The processing required for each kernel is performed by a grid of thread blocks. Using concurrent kernel execution, streams, and synchronization with lightweight events, the platform 600 of FIG. 6 (or similar architectures) may be used to parallelize various operations involved with solving the computational model. The graphical processing device 610 includes one or more thread blocks 630 which represent the computation unit of the graphical processing device. The term thread block refers to a group of threads that can cooperate via shared memory and synchronize their execution to coordinate memory accesses. For example, in FIG. 6, threads 640, 645 and 650 operate in thread block 630 and access shared memory 635. Depending on the parallel computing platform used, thread blocks may be organized in a grid structure. A computation or series of computations may then be mapped onto this grid. For example, in embodiments utilizing CUDA, computations may be mapped on one-, two-, or three-dimensional grids. Each grid contains multiple thread blocks, and each thread block contains multiple threads. For example, in FIG. 6, the thread blocks 630 are organized in a two dimensional grid structure with m+1 rows and n+1 columns. Generally, threads in different thread blocks of the same grid cannot communicate or synchronize with each other. However, thread blocks in the same grid can run on the same multiprocessor within the GPU at the same time. The number of threads in each thread block may be limited by hardware or software constraints.

Continuing with reference to FIG. 6, registers 655, 660, and 665 represent the fast memory available to thread block 630. Each register is only accessible by a single thread. Thus, for example, register 655 may only be accessed by thread 640. Conversely, shared memory is allocated per thread block, so all threads in the block have access to the same shared memory. Thus, shared memory 635 is designed to be accessed, in parallel, by each thread 640, 645, and 650 in thread block 630. Threads can access data in shared memory 635 loaded from device memory 620 by other threads within the same thread block (e.g., thread block 630). The device memory 620 is accessed by all blocks of the grid and may be implemented using, for example, Dynamic Random-Access Memory (DRAM).

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A computer-implemented method for sparse recovery of fiber orientations using a multidimensional Prony method for use in tractography applications, the method comprising:
    performing magnetic resonance imaging through a MR imaging device to acquire a plurality of sparse signal measurements of neuronal fibers in a white matter of a brain, using a q-space sampling scheme which enforces a lattice structure with a predetermined number of collinear samples, wherein the MR imaging device includes a q-space component processor unit and an image data processor, and the q-space component processor is configured to provide an MR dataset to the image data processor for processing into an image;
    for each voxel included in the plurality of sparse signal measurements, using a computer system to perform a parameter estimation process comprising:
        translating a portion of the sparse signal measurements corresponding to the voxel into a plurality of Sparse Approximate Prony Method (SAPM) input parameters, and
        applying a SAPM process to the SAPM input parameters to recover a number of fiber populations, a plurality of orientation vectors, and a plurality of amplitude scalars; and
    generating one or more tractogram images of the neuronal fibers in the white matter of the brain on a display through the image data processor, using the number of fiber populations, the plurality of orientation vectors, and the plurality of amplitude scalars recovered for each voxel.

2. The method of claim 1, wherein the q-space sampling scheme is a Diffusion Spectrum Imaging (DSI) grid sampling scheme employing a 3D grid which is subsampled by sampling collinearly along a plurality of random lines in 3D space.

3. The method of claim 1, wherein the q-space sampling scheme utilizes a single gradient table with a plurality of b-values.

4. The method of claim 3, wherein the q-space sampling scheme is a multi-shell sampling scheme with samples placed collinearly along a plurality of random rays passing through a common origin of shells in 3D space.

5. The method of claim 1, wherein the portion of the sparse signal measurements corresponding to the voxel is translated into the SAPM input parameters by formulating the sparse signal measurements corresponding to the voxel as a finite sum of the plurality of orientation vectors and the plurality of amplitude scalars multiplied by a Fourier transform of a kernel.

6. The method of claim 5, wherein the kernel is a Gaussian kernel.

7. The method of claim 1, wherein the SAPM process utilizes a Matrix Pencil Prony method to solve a series of Finite Rate of Innovation (FRI) problems to recover the number of fiber populations, the plurality of orientation vectors, and the plurality of amplitude scalars.

8. The method of claim 1, wherein the SAPM process utilizes a MUSIC Prony method to solve a series of FRI problems to recover the number of fiber populations, the plurality of orientation vectors, and the plurality of amplitude scalars.

9. The method of claim 1, wherein the computer system is a parallel computing architecture and the parameter estimation process is performed for multiple voxels in parallel across a plurality of processing units.

10. An article of manufacture for sparse recovery of fiber orientations using a multidimensional Prony method for use in tractography applications, the article of manufacture comprising a non-transitory, tangible computer-readable medium holding computer-executable instructions for performing a method comprising:
    receiving a plurality of sparse signal measurements of neuronal fibers in a white matter of a brain through a MR imaging device, wherein the plurality of sparse signal measurements of neuronal fibers are acquired using a q-space sampling scheme which enforces a lattice structure with a predetermined number of collinear samples, wherein the MR imaging device includes a q-space component processor unit and an image data processor, and the q-space component processor is configured to provide an MR dataset to the image data processor for processing into an image;
    for each voxel included in the plurality of sparse signal measurements, performing a parameter estimation process comprising:
        translating a portion of the sparse signal measurements corresponding to the voxel into a plurality of Sparse Approximate Prony Method (SAPM) input parameters, and
        applying a SAPM process to the SAPM input parameters to recover a number of fiber populations, a plurality of orientation vectors, and a plurality of amplitude scalars; and
    generating one or more tractogram images of the neuronal fibers in the white matter of the brain on a display through the image data processor, using the number of fiber populations, the plurality of orientation vectors, and the plurality of amplitude scalars recovered for each voxel.

11. The article of manufacture of claim 10, wherein the portion of the sparse signal measurements corresponding to the voxel is translated into the SAPM input parameters by formulating the sparse signal measurements corresponding to the voxel as a finite sum of the plurality of orientation vectors and the plurality of amplitude scalars multiplied by a Fourier transform of a kernel.

12. The article of manufacture of claim 11, wherein the kernel is a Gaussian kernel.

13. The article of manufacture of claim 10, wherein the SAPM process utilizes a Matrix Pencil Prony method to solve a series of Finite Rate of Innovation (FRI) problems to recover the number of fiber populations, the plurality of orientation vectors, and the plurality of amplitude scalars.

14. The article of manufacture of claim 10, wherein the SAPM process utilizes a MUSIC Prony method to solve a series of FRI problems to recover the number of fiber populations, the plurality of orientation vectors, and the plurality of amplitude scalars.

15. A system for sparse recovery of fiber orientations using a multidimensional Prony method for use in tractography applications, the system comprising:
   an magnetic resonance imaging device comprising a plurality of coils configured to acquire a plurality of sparse signal measurements of neuronal fibers in a white matter of a brain, using a q-space sampling scheme which enforces a lattice structure with a predetermined number of collinear samples, an image data processor, and a q-space component processor configured to provide an MR dataset to the image data processor for processing into an image;
   a computer system configured to:
      perform a parameter estimation process for each voxel included in the plurality of sparse signal measurements, the parameter estimate process comprising:
         translating a portion of the sparse signal measurements corresponding to the voxel into a plurality of Sparse Approximate Prony Method (SAPM) input parameters, and
         applying a SAPM process to the SAPM input parameters to recover a number of fiber populations, a plurality of orientation vectors, and a plurality of amplitude scalars; and
      generate one or more tractogram images of the neuronal fibers in the white matter of the brain on a display through the image data processor, using the number of fiber populations, the plurality of orientation vectors, and the plurality of amplitude scalars recovered for each voxel.

16. The system of claim 15, wherein the q-space sampling scheme is a Diffusion Spectrum Imaging (DSI) grid sampling scheme employing a 3D grid which is subsampled by sampling collinearly along a plurality of random lines in 3D space.

17. The system of claim 15, wherein the q-space sampling scheme utilizes a single gradient table with a plurality of b-values.

18. The system of claim 17, wherein the q-space sampling scheme is a multi-shell sampling scheme with samples placed collinearly along a plurality of random rays passing through a common origin of shells in 3D space.

19. The system of claim 15, wherein the portion of the sparse signal measurements corresponding to the voxel is translated into the SAPM input parameters by formulating the sparse signal measurements corresponding to the voxel as a finite sum of the plurality of orientation vectors and the plurality of amplitude scalars multiplied by a Fourier transform of a kernel.

20. The system of claim 15, wherein the computer system is a parallel computing architecture and the parameter estimation process is performed for multiple voxels in parallel across a plurality of processing units.

* * * * *